(12) United States Patent
Boemmels

(10) Patent No.: US 10,374,084 B2
(45) Date of Patent: Aug. 6, 2019

(54) VERTICAL CHANNEL DEVICES AND METHOD OF FABRICATING SAME

(71) Applicant: IMEC vzw, Leuven (BE)

(72) Inventor: Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/980,611

(22) Filed: May 15, 2018

(65) Prior Publication Data
US 2018/0342616 A1    Nov. 29, 2018

(30) Foreign Application Priority Data

May 15, 2017  (EP) ..................................... 17171135

(51) Int. Cl.
  *H01L 21/8238*  (2006.01)
  *H01L 29/78*    (2006.01)
  (Continued)

(52) U.S. Cl.
  CPC .. *H01L 29/7827* (2013.01); *H01L 21/823475* (2013.01); *H01L 21/823487* (2013.01);
  (Continued)

(58) Field of Classification Search
  CPC ........... H01L 29/7827; H01L 29/66666; H01L 21/823885; H01L 21/823487;
  (Continued)

(56) References Cited

U.S. PATENT DOCUMENTS 9,419,003 B1 *  8/2016  Colinge .............. H01L 27/1104
9,966,456 B1 *  5/2018  Park .................. H01L 29/66666
  (Continued)

Primary Examiner — William F Kraig
Assistant Examiner — Khatib A Rahman
(74) Attorney, Agent, or Firm — Knobbe Martens Olson & Bear, LLP

(57) ABSTRACT

The disclosed technology generally relates to semiconductor devices and more particularly to vertical channel devices and a method of making the same. In one aspect, a method of forming vertical channel devices includes forming a first vertical channel structure extending from a first bottom electrode region and a second vertical channel structure extending from a second bottom electrode region. The first and the second vertical channel structures protrude from a dielectric layer covering the first and second bottom electrode regions. The method additionally comprises forming a first hole exposing the first bottom electrode region and a second hole exposing the second bottom electrode region, where the first and the second holes extending vertically through the dielectric layer. The method additionally includes forming a conductive pattern including a set of discrete pattern parts on the dielectric layer. Forming the conductive pattern includes forming a first pattern part including a first gate portion wrapping around a protruding portion of the first vertical channel structure, where a first bottom electrode contact portion is arranged in the second hole, and a first cross-coupling portion extending between the first bottom electrode contact portion and the first gate portion. Forming the conductive pattern additionally includes forming a second pattern part including a second gate portion wrapping around a protruding portion of the second vertical channel structure, where a second bottom electrode contact portion is arranged in the first hole, and a cross-coupling portion extending between the second bottom electrode contact portion and the second gate portion.

14 Claims, 10 Drawing Sheets

(51) Int. Cl.
  *H01L 21/8234* (2006.01)
  *H01L 27/11* (2006.01)
  *H01L 29/15* (2006.01)
  *H01L 29/66* (2006.01)

(52) U.S. Cl.
  CPC ........... *H01L 21/823871* (2013.01); *H01L 21/823885* (2013.01); *H01L 27/1104* (2013.01); *H01L 29/152* (2013.01); *H01L 29/66666* (2013.01)

(58) Field of Classification Search
  CPC ......... H01L 21/823871; H01L 27/2454; H01L 21/823828; H01L 21/823437; H01L 2029/7858; H01L 29/42392
  See application file for complete search history.

(56) References Cited

U.S. PATENT DOCUMENTS

| | | | |
|---|---|---|---|
| 2007/0111455 A1* | 5/2007 | Kim | H01L 29/66795 438/286 |
| 2011/0012193 A1* | 1/2011 | Nojima | H01L 29/66666 257/329 |
| 2011/0233512 A1* | 9/2011 | Yang | B82Y 10/00 257/9 |
| 2017/0025412 A1* | 1/2017 | Jun | H01L 21/823487 |
| 2017/0373071 A1* | 12/2017 | Lim | H01L 27/1104 |
| 2018/0083136 A1* | 3/2018 | Xie | H01L 29/7827 |
| 2018/0151561 A1* | 5/2018 | Cantoro | H01L 27/088 |
| 2018/0175214 A1* | 6/2018 | Chen | H01L 21/823807 |

\* cited by examiner

VERTICAL CHANNEL DEVICES AND METHOD OF FABRICATING SAME

CROSS-REFERENCE TO RELATED APPLICATIONS

This application claims foreign priority to European Patent Application No. EP 17171135.1, filed May 15, 2017, the content of which is incorporated by reference herein in its entirety.

BACKGROUND

Technological Field

The disclosed technology generally relates to semiconductor devices and more particularly to vertical channel devices and a method of making the same.

Description of the Related Technology

There is a general objective in the semiconductor industry to scale integrated circuit (IC) devices, e.g., by reducing the area occupied by discrete devices such as transistors, and to correspondingly increase the device density per unit area. To this end, various new process architectures for semiconductor devices are being developed for the purpose of providing more area efficient circuit designs. One promising type of device includes vertical channel transistor devices, such as vertical nanowire field effect transistors (FETs). In vertical nanowire FETs, due to the vertically oriented channel structure, the lateral footprint occupied by the gate length does not scale with a linewidth of the gate as in traditional planar FETs but instead scales with the thickness of the gate. Secondly, the source and drain regions of a vertical transistor device are vertically displaced in relation to each other. For these reasons, among others, vertical transistor devices enable dense device integrations.

Interconnecting the gates and source/drains of different devices is often needed to form functioning circuits. However, since the source, drain and gates of a vertical device are arranged at different vertical levels it may be challenging to electrically contact the bottom source/drain region. One option is to provide the interconnections between gates and source/drains by metal lines of above routing or interconnection layers (i.e. in the back-end-of-line), which metal lines are connected to the bottom source/drain regions and gates, respectively, by long vertical interconnects. This, however, may reduce the overall area efficiency since additional space then is needed for the vertical interconnects. Embodiments disclosed herein address these and other challenges associated with scaling IC devices.

SUMMARY OF CERTAIN INVENTIVE ASPECTS

In one aspect, the disclosed technology addresses the challenge of the reduction in overall area efficiency. In another aspect, the disclosed technology enables the formation of vertical channel devices with interconnected gates and bottom electrodes. Additional aspects or alternative aspects of the disclosed technology are described below.

In one aspect, the present disclosed technology provides a method of forming an interconnected vertical channel device on a semiconductor structure. A first vertical channel structure extends from a first bottom electrode region and a second vertical channel structure extends from a second bottom electrode region. The first and the second vertical channel structures protrude from a dielectric layer covering the first and second bottom electrode regions. A first hole is formed, exposing the first bottom electrode region and a second hole is formed, exposing the second bottom electrode region. The first and the second hole extend vertically through the dielectric layer, and form a conductive pattern including a set of discrete pattern parts on the dielectric layer. Forming the conductive pattern includes forming a first pattern part including a first gate portion wrapping around a protruding portion of the first vertical channel structure, a first bottom electrode contact portion arranged in the second hole, and a first cross-coupling portion extending between the first bottom electrode contact portion and the first gate portion, and forming a second pattern part including a second gate portion wrapping around a protruding portion of the second vertical channel structure, a second bottom electrode contact portion arranged in the first hole, and a cross-coupling portion extending between the second bottom electrode contact portion and the second gate portion.

In one aspect, the disclosed technology enables a direct connection between gate level conductor and the bottom electrode. More specifically, a gate of a first vertical channel device (i.e. the device including the first vertical channel structure and the first wrap-around gate) may be electrically interconnected with a bottom electrode of a second vertical channel device (i.e. the device including the second vertical channel structure and the second wrap-around gate), and vice versa. Hence, the conductive pattern provides a double function of providing gates for the vertical channel devices and acting as a "routing layer" allowing a compact and area efficient connection between the gates and the bottom electrodes of the first and second vertical channel devices.

The method may be advantageously applied for forming any circuitry requiring connections between the gate of one device and a source/drain of another device. The devices may preferably be a first vertical channel transistor device and a second vertical channel transistor device. The method may be particularly advantageous for forming circuitry including cross-coupled complementary metal oxide semiconductors (CMOS), notably static random access memory (SRAM) bit cells.

According to the disclosed technology, the connection between the bottom electrode and the gate level conductor is enabled by merely forming the first and second holes prior to forming the conductive pattern. This results in an efficient process with respect to the number of process steps.

Vertical channel structure may comprise a semiconductor structure oriented vertically or transverse with respect to the main plane of extension of the semiconductor structure. An orientation of the channel structure may refer to the direction of the flow of charge carriers through the structure or a longitudinal direction of the structure. The vertical channel structure may be formed on a substrate, wherein (a longitudinal direction of) the "vertical" channel structures are oriented along a normal direction to (a main surface of) the substrate. The vertical channel structure may preferably be formed by a vertical "nanowire". Correspondingly, a vertical channel (transistor) device may comprise a (transistor) device having a channel oriented vertically or transverse with respect to the main plane of extension of the semiconductor structure.

A gate portion wrapping around a vertical channel structure, or a wrap-around gate portion of a vertical channel structure, may comprise the gate portion that completely encloses the vertical channel structure in a circumferential direction, i.e. along a vertical section of the vertical channel structure.

As used herein, the term "horizontal" will be used to refer to an orientation or a direction which is transverse to the vertical direction. The semiconductor structure may include a substrate wherein a "horizontal" direction refers to a direction parallel to (a main surface of) the substrate.

A first feature such as a layer, a level, a structure or other element, being formed "on" a second feature such as a layer, a level, a structure or other element, may comprise the first feature that is formed directly on the second feature, i.e. in abutment with the second feature, or with one or more layers intermediate the first and the second feature, i.e. not in direct contact with the second feature.

A first feature such as a layer, a level, a structure or other element, being formed "above" a second feature such as a layer, a level, a structure or other element, may comprise the first feature that is formed above the second feature along (or as seen) in the vertical direction.

The protruding portions of the first and second vertical channel structures, i.e. the portions of the first and second vertical channel structures protruding/extending above the dielectric layer, may be covered by a thin layer (for instance a gate dielectric layer). Alternatively, no covering layer need to be present while the semiconductor material of the protruding portions of the first and second vertical channel structures may be laid bare. In the latter case, a gate dielectric layer may be formed on the vertical channel structures prior to forming the conductive pattern.

A first or second bottom electrode region may comprise a region forming a source or drain region with respect to the first or second vertical channel structure. A third or fourth bottom electrode region may comprise a region forming a source or drain region with respect to the third or fourth channel structure. A plurality of bottom electrode regions may each comprise a region forming a source or drain region with respect to their corresponding structure. For example, the plurality of bottom electrode regions may include a fifth bottom electrode, a twentieth bottom electrode, a fiftieth bottom electrode, a hundredth bottom electrode or even a higher numbered bottom electrode. The semiconductor structure may include a substrate, wherein the respective bottom electrode regions may be formed in respective regions of the substrate.

Vertical channel structures formed on a same bottom electrode region may be electrically interconnected through the bottom electrode region.

The first and the second bottom electrode regions may be laterally spaced apart by an isolation region, for instance formed by the dielectric layer covering the first and second bottom electrode regions. The first and second bottom electrode regions may accordingly be electrically isolated from each other.

The first or second hole exposing the first or second bottom electrode region may comprise a portion of the first or second bottom electrode region that is laid bare such that the first or second bottom electrode contact portion may be formed in abutment with the exposed portion, and thus in galvanic contact with the bottom electrode region. The third or fourth hole exposing the third or fourth bottom electrode region may comprise a portion of the third or fourth bottom electrode region that is laid bare such that the third or fourth bottom electrode contact portion may be formed in abutment with the exposed portion, and thus in galvanic contact with the bottom electrode region. There may be a plurality of holes. For example, there may be a fifth hole, a twentieth hole, a fiftieth hole, a hundredth hole or even a higher numbered hole.

The conductive pattern may include a single conductive material or a combination of different materials such that the combination forms a conductive material. The conductive pattern may include a single metal or a combination of different metals. A "metal" may in this case refer to a single element metal or a mixture or an alloy of one or different single element metals.

"Discrete pattern parts" may comprise pattern parts that are physically separated or spaced apart to form physically disconnected parts of the conductive pattern.

Each of the first and the second discrete pattern part, forms a continuous conductive pattern or structure, extending interrupted between the first or second bottom electrode portion to the second or first vertical channel structure. Accordingly, the bottom electrode contact portion, the cross-coupling portion and the gate portion of the first and second pattern part, respectively, refers to different portions of a same, continuous conductive pattern or structure. There may be a plurality of discrete pattern parts. For example, there may be a fifth pattern part, a twentieth pattern part, a fiftieth pattern part, a hundredth pattern part or even a higher numbered patterned part.

The first or second bottom electrode contact portion represents a portion of the first or second pattern part extending from the first or second bottom electrode region, through the second or first hole and protruding from the hole. The first or second bottom electrode contact portion hence forms an elevated bottom electrode contact for the first or second bottom electrode region. There may be a plurality of bottom electrode contact portion. For example, there may be a fifth bottom electrode contact portion, a twentieth bottom electrode contact portion, a fiftieth bottom electrode contact portion, a hundredth bottom electrode contact portion or even a higher numbered bottom electrode contact portion.

The first or second gate portion represents a portion of the first or second pattern part extending about a portion of the first or second vertical channel structure. There may be a plurality of gate portion. For example, there may be a fifth gate portion, a twentieth gate portion, a fiftieth gate portion, a hundredth gate portion or even a higher numbered gate portion.

The first or second cross-coupling portion represents a portion of the first or second pattern part extending between, and thus connecting, the first or second gate portion and the first or second bottom electrode contact portion. There may be a plurality of cross-coupling portion. For example, there may be a fifth cross-coupling portion, a twentieth cross-coupling portion, a fiftieth cross-coupling portion, a hundredth cross-coupling portion or even a higher numbered cross-coupling portion.

According to one embodiment, the method comprises forming a gate level conductor including at least one conductive layer, the gate level conductor filling the first and the second hole and embedding the protruding portions of the first and second vertical channel structures, wherein forming the conductive pattern further includes forming an etch mask above the gate level conductor, the etch mask including a first discrete mask portion for defining the first pattern part and a second discrete mask portion for defining the second pattern part, and etching the gate level conductor in a region exposed by the etch mask. In some embodiments, a plurality of holes, such as the fifth hole, twentieth hole, hundredth hole, or even a higher numbered hole may be filled by the gate level conductor. In some embodiments, a plurality of channel structures, such as the fifth channel structure, twentieth channel structure, hundredth channel structure, or even a higher numbered channel structure may be filled by the gate level conductor. In some embodiments, the etch mask includes a plurality of discrete mask portions, such as the fifth discrete mask portion, twentieth discreet mask portion, hundredth discreet mask portion, or even a higher numbered discreet mask portion. In some embodiments, the pattern part includes a plurality of pattern part, such as the fifth pattern part, twentieth discreet pattern part, hundredth pattern part, or even a higher numbered pattern part.

The gate level conductor may accordingly be patterned such that gate-, bottom electrode contact-, and cross-coupling portions are formed.

The first or second gate portion may be formed by a portion of the gate level conductor remaining (subsequent to the etching) about the first or second vertical channel structure. The first or second bottom electrode contact portion may be formed by a portion of the gate level conductor remaining in the second or first hole and protruding therefrom. The first or second cross-coupling portion may be formed by a remaining portion of the gate level conductor extending between the first or second gate portion and bottom electrode contact portion. In some embodiments, the bottom electrode contact portion includes a plurality of bottom electrode contact portion, such as the fifth bottom electrode contact portion, twentieth bottom electrode contact portion, hundredth bottom electrode contact portion, or even a higher numbered bottom electrode contact portion. In some embodiments, the cross-coupling portion includes a plurality of cross-coupling portion, such as the fifth cross-coupling portion, twentieth cross-coupling portion, hundredth cross-coupling portion, or even a higher numbered cross-coupling portion.

In case, the gate level conductor is a compound layer of two or more conductive layers, one or more of the constituent layers may "fill" the first and the second hole.

The gate level conductor may be formed to only partially embed the first and second vertical channel structures. Hence, the first and the second vertical channel structures may protrude above an upper horizontal surface of the gate level conductor. The gate level conductor may also be formed to completely embed, and cover, the first and the second vertical channel structures. Hence, an upper horizontal surface of the gate level conductor may be arranged at a level above a top portion of the first and the second vertical channel structures.

The gate level conductor may include a conformal metal contact layer formed on the protruding portions of the first and second vertical channel structures and in the hole, and a metal fill layer formed on the conformal metal contact layer and embedding the protruding portions of the first and second vertical channel structures.

A "conformal" layer comprises a layer of a uniform or substantially uniform thickness. A "conformal" layer may also be understood as a layer deposited in a conformal deposition process. A conformal layer may be formed by depositing the material of the layer by atomic layer deposition (ALD).

According to the present embodiment, a metal contact material may be reliably deposited on and in abutment with the (exposed portion) of the first and the second bottom electrode regions, even for high aspect ratio holes.

Due to the nature of conformal deposition, the metal contact layer may cover also the dielectric layer. Accordingly, subsequent to forming the conductive pattern, a respective metal contact layer portion may extend interrupted from the bottom of the first or second hole to the first or second gate portion.

The material of the metal contact layer may be selected to present a work function appropriate with respect to the material of the first and second bottom electrode regions and to have good conductive properties with respect to the semiconductor material bottom electrode regions. The material of the metal fill layer may be selected to present good filling properties, to allow deposition in a relatively quick process and to have good conductive properties.

The conformal metal contact layer and the metal fill layer may be formed subsequent to forming the first and the second hole.

The metal fill layer may be formed to fill a remaining space in the first and the second hole. A "remaining space" here refers to a space of the hole which remains after the metal contact layer has been formed in the hole. This enables the entire cross-sectional dimension of the hole to be filled with metal. This further enables forming of a low-resistance connection between the respective bottom electrode regions and gate portions.

The gate level conductor may further include a conformal work function metal layer formed prior to forming the first and the second holes, on the protruding portions of the first and second vertical channel structures and on the dielectric layer, wherein forming the first and the second holes includes forming the first and the second hole to extend through the conformal work function metal layer and the dielectric layer.

Thereby different metals, optimized for gate purpose and bottom electrode contact purposes, may be formed on the first and second vertical channel structures, and in the first and second hole, respectively. In particular, the material of the work function metal layer may be selected to present a work function appropriate with respect to the material of the vertical channel structures.

The method may further comprise, prior to forming the etch mask, removing conductive layer portions from an upper portion of the first and the second channel structures. Especially, portions of the conformal work function metal layer, the conformal metal contact layer and/or the metal fill layer covering the upper portion of the first and the second channel structures may be removed. The length of the gates (i.e. the vertical dimension of the gates) may thereby be defined. Moreover, exposing the upper portions of the vertical channel structures may allow further device processing, such as formation of top electrodes.

Removing the conductive layer portions prior to forming the etch mask and patterning the gate level conductor, as opposed to after patterning the gate level conductor, simplifies the process since the removing of the conductive layer portions then will not affect the lateral dimensions of the conductive pattern parts.

According to one embodiment, the gate level conductor is formed to completely cover the protruding portions of the first and second vertical channel structures, the method further comprising, prior to forming the etch mask, reducing a thickness of the gate level conductor such that an upper portion (of the previously protruding portions) of the first and second vertical channel structures is exposed.

According to the present embodiment, upper portions of the vertical channel structures may be exposed and the gate length for the first and the second vertical channel structures may be defined in a common process step.

Due to the vertical orientation of the channel structures, the gate length for the first and second channel structures is defined by the thickness of the gate level conductor, i.e. the dimension along the vertical direction.

The thickness reduction may include etching back an upper surface of the gate level conductor selectively with respect to a gate dielectric layer covering the vertical channel structures. Thereby the vertical channel structures may be protected from etching chemistries used during the thickness reduction.

The method may further comprise, prior to forming the first and second hole (and prior to forming the conformal work function metal layer if such a layer is to be formed), forming a gate dielectric layer (preferably a conformal gate dielectric layer) covering the dielectric layer and the protruding portions of the first and the second vertical channel structures, wherein forming the first and the second hole includes forming the first and the second hole to extend through the gate dielectric layer and the dielectric layer. Forming the gate dielectric layer prior to forming the holes facilitates subsequent contacting with the first and second bottom electrode regions.

The method may further comprise forming a dielectric fill layer embedding the pattern parts, wherein a top portion of the first and the second vertical channel structures protrudes above the dielectric fill layer. This allows the conductive pattern to be electrically isolated from above conducting structures, such as top electrodes and/or routing layers.

The method may further comprise forming a first top electrode at the top portion of the first vertical channel structure and a second top electrode at the top portion of the second vertical channel structure.

According to one embodiment of the disclosed technology, the semiconductor structure further comprises a third vertical channel structure extending from the first bottom electrode region and a fourth vertical channel structure extending from the second bottom electrode region, wherein the first gate portion of the first pattern part is formed as a common first gate portion wrapping around the first and third vertical channel structure, and wherein the second gate portion of the second pattern part is formed as a common second gate portion wrapping around the second and fourth vertical channel structure.

In some embodiments, two pairs of vertical channel devices having cross-coupled gates and bottom electrodes can be formed. That is the first cross-coupling portion extends between the first bottom electrode contact portion and the common first gate portion. Correspondingly, the second cross-coupling portion extends between the second bottom electrode contact portion and the common second gate portion. Area forming of the building blocks for cross-coupled inverters in an area-efficient manner may be enabled. Cross-coupled inverters enable forming of SRAM bit cells.

The first bottom electrode region may include a first sub-region and a second sub-region wherein the first vertical channel structure extends from the first sub-region and the third vertical channel structure extends from the second sub-region. One of the first or second sub-regions may be doped with a p-type dopant and the other one may be doped with an n-type dopant. A CMOS-pair may hence be formed on the first bottom electrode region.

The second bottom electrode region may include a first sub-region and a second sub-region wherein the second vertical channel structure extends from the first sub-region and the fourth vertical channel structure extends from the second sub-region. One of the first or second sub-regions may be doped with a p-type dopant and the other one may be doped with an n-type dopant. A CMOS-pair may hence be formed on the second bottom electrode region.

The semiconductor structure may further comprise a fifth vertical channel structure extending from the first bottom electrode region and a sixth vertical channel structure extending from the second bottom electrode region, wherein forming the conductive pattern includes: forming a fifth pattern part including a gate portion wrapping around a protruding portion of the fifth vertical channel structure, and forming a sixth pattern part including a gate portion wrapping around a protruding portion of the sixth vertical channel structure. The semiconductor structure may further comprise more vertical channel structures that extend from their corresponding electrode region, wherein forming the conductive pattern further includes forming a corresponding pattern part including a gate portion wrapping around a protruding portion of the corresponding vertical channel structure.

Accordingly, three vertical channel devices may be formed on each one of the first and second bottom electrode regions, wherein two of the devices on each bottom electrode region have a common gate coupled to the other bottom electrode region and the third device of each bottom electrode region (i.e. the fifth and sixth vertical channel device, respectively) may be provided with respective electrically independent gates. This enables forming of SRAM bit cells.

The first bottom electrode region may, in addition to the afore-mentioned first and second sub-regions include a third sub-region wherein the fifth vertical channel structure extends from the third sub-region. The first and third sub-regions may be doped with a p-type dopant and the second sub-region may be doped with an n-type dopant. Alternatively, the first and third sub-regions may be doped with an n-type dopant and the second sub-region may be doped with a p-type dopant. A CMOS-pair supplemented with an n-type or p-type device may hence be formed on the first bottom electrode region.

The second bottom electrode region may, in addition to the afore-mentioned first and second sub-regions include a third sub-region wherein the sixth vertical channel structure extends from the third sub-region. The first and third sub-regions may be doped with a p-type dopant and the second sub-region may be doped with an n-type dopant. Alternatively, the first and third sub-regions may be doped with an n-type dopant and the second sub-region may be doped with a p-type dopant. A CMOS-pair supplemented with an n-type or p-type device may hence be formed on the second bottom electrode region.

According to a second aspect of the present disclosed technology, there is provided a semiconductor structure comprising: a substrate comprising a first bottom electrode region and a second bottom electrode region, a first vertical channel structure extending from the first bottom electrode region and a second vertical channel structure extending from the second bottom electrode region, a dielectric layer covering the first and second bottom electrode regions, wherein the first and the second vertical channel structures protrudes from the dielectric layer, and a conductive pattern including a set of discrete pattern parts arranged on the dielectric layer and including: a first pattern part including a first gate portion wrapping around a protruding portion of the first vertical channel structure, a first bottom electrode contact portion extending through the dielectric layer into abutment with the second bottom electrode region, and a first cross-coupling portion extending between the first bottom electrode contact portion and the first gate portion, and a second pattern part including a second gate portion wrapping around a protruding portion of the second vertical channel structure, a second bottom electrode contact portion extending through the dielectric layer into abutment with the first bottom electrode region, and a second cross-coupling portion extending between the second bottom electrode contact portion and the second gate portion.

As may be understood from the discussion in connection with the first aspect, the semiconductor structure of the second aspect enables area-efficient circuitry including vertical channel devices. The conductive pattern may be used as a "routing layer" allowing a compact and area efficient connection between gates and bottom electrodes of a first and a second vertical channel transistor device. The various advantages, details and embodiments discussed in connection with the first aspect apply correspondingly to the second aspect. Reference is therefore made to the above.

The semiconductor structure may further comprise a third vertical channel structure extending from the first bottom electrode region and a fourth vertical channel structure extending from the second bottom electrode region, wherein the first gate portion of the first pattern part is formed as a common first gate portion wrapping around the first and third vertical channel structures, and wherein the second gate portion of the second pattern part is formed as a common second gate portion wrapping around the second and fourth vertical channel structures.

The semiconductor structure hence provides two pairs of vertical devices having cross-coupled gates and bottom electrodes.

The semiconductor structure may further comprise a fifth vertical channel structure extending from the first bottom electrode region and a sixth vertical channel structure extending from the second bottom electrode region, wherein the conductive pattern further includes a third pattern part including a gate portion wrapping around a protruding portion of the fifth vertical channel structure, and a sixth pattern part including a gate portion wrapping around a protruding portion of the sixth vertical channel structure. In some embodiments, a plurality of vertical channel structures extend from their corresponding bottom electrode region, wherein the conductive pattern includes the corresponding pattern part that includes a gate portion wrapping around a protruding portion of the corresponding vertical channel structure. The vertical channel structure could include the fifth vertical channel structure, the twentieth vertical channel structure, the fiftieth vertical channel structure, the hundredth vertical channel structure or even a higher numbered vertical channel structure.

The semiconductor structure may further comprise a dielectric fill layer embedding the conductive pattern, and a respective top electrode arranged on the dielectric fill layer and in contact with a top portion of a respective one of the vertical channel structures.

An upper surface of the dielectric fill layer may be arranged at a level below the top portion of the vertical channel structures.

BRIEF DESCRIPTION OF THE DRAWINGS

The above, as well as additional objects, features and advantages of the present disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method for forming interconnected vertical channel devices will now be described with reference to FIGS. 1a-1m.

Figure 1A:
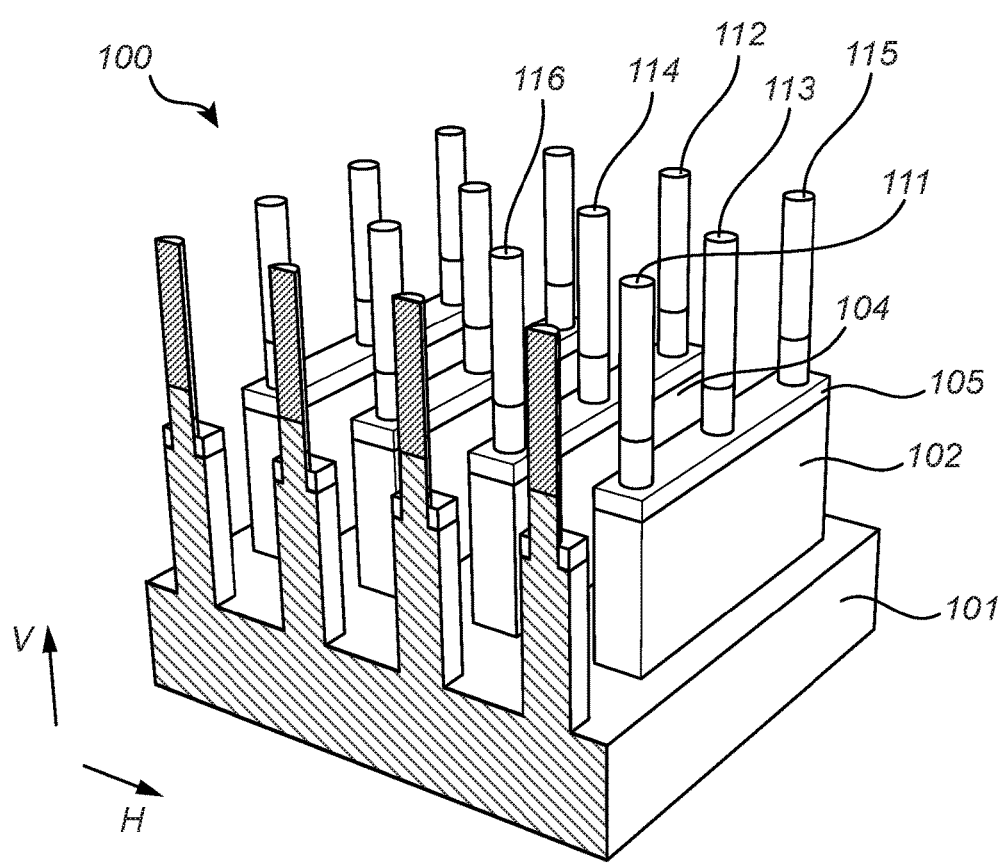
FIG. 1a illustrates an intermediate semiconductor structure at a stage in fabrication of vertical channel devices, including a first bottom electrode region and a second bottom electrode region, as well as a first vertical channel and a second vertical channel, according to embodiments.
Figure 1B:
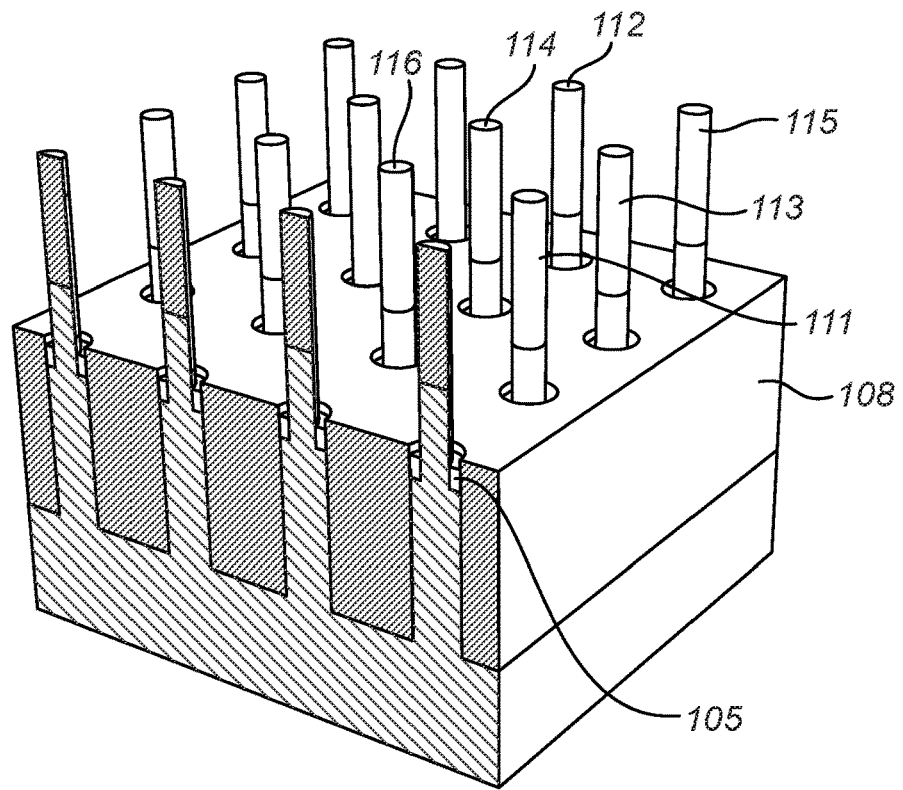
FIG. 1b illustrates an intermediate semiconductor structure at a stage in fabrication of vertical channel devices, where a dielectric layer covering the first and second bottom electrode regions illustrated in FIG. 1a. The first and second vertical channels protrude from the dielectric layer.

With reference to FIGS. 1a-1b, the devices are formed on a semiconductor structure 100. The semiconductor structure 100 comprises a first bottom electrode region 102 and a second bottom electrode region 104. The semiconductor structure 100 comprises a first vertical channel structure 111 arranged on the first bottom electrode region 102 and a second vertical channel structure 112 arranged on the second bottom electrode region 104. The semiconductor structure 100 comprises a dielectric layer 108 covering the first and second bottom electrode regions 102, 104. The first and the second vertical channel structures 111, 112 protrude from the dielectric layer 108.

Figure 1C:
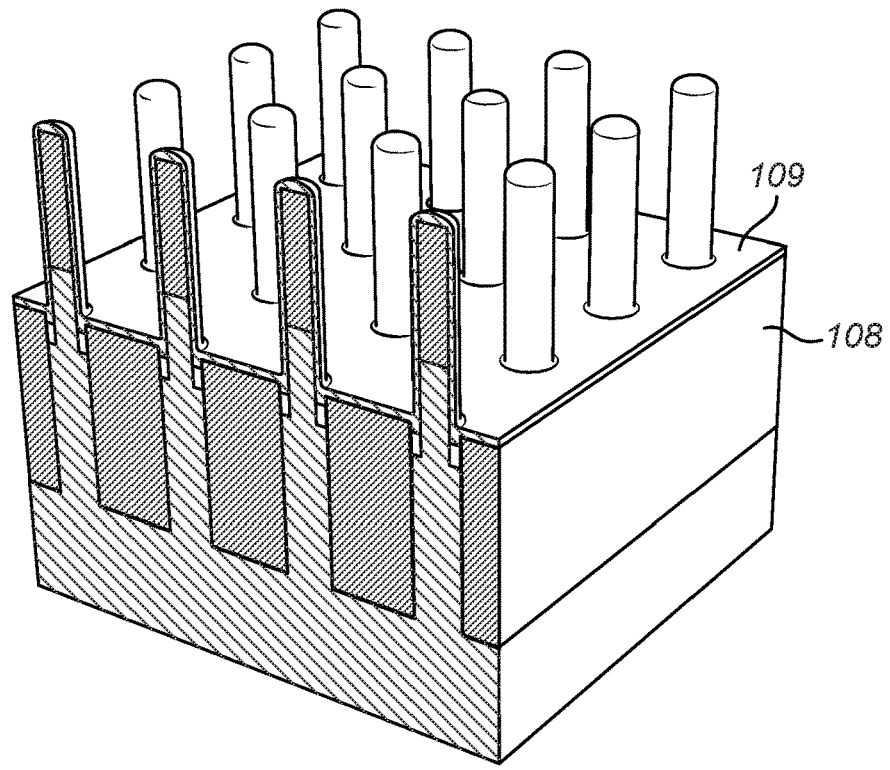
FIG. 1c illustrates an intermediate semiconductor structure at a stage in fabrication of vertical channel devices, including a conformal gate dielectric player which covers the dielectric layer illustrated in FIG. 1b.
Figure 1D:
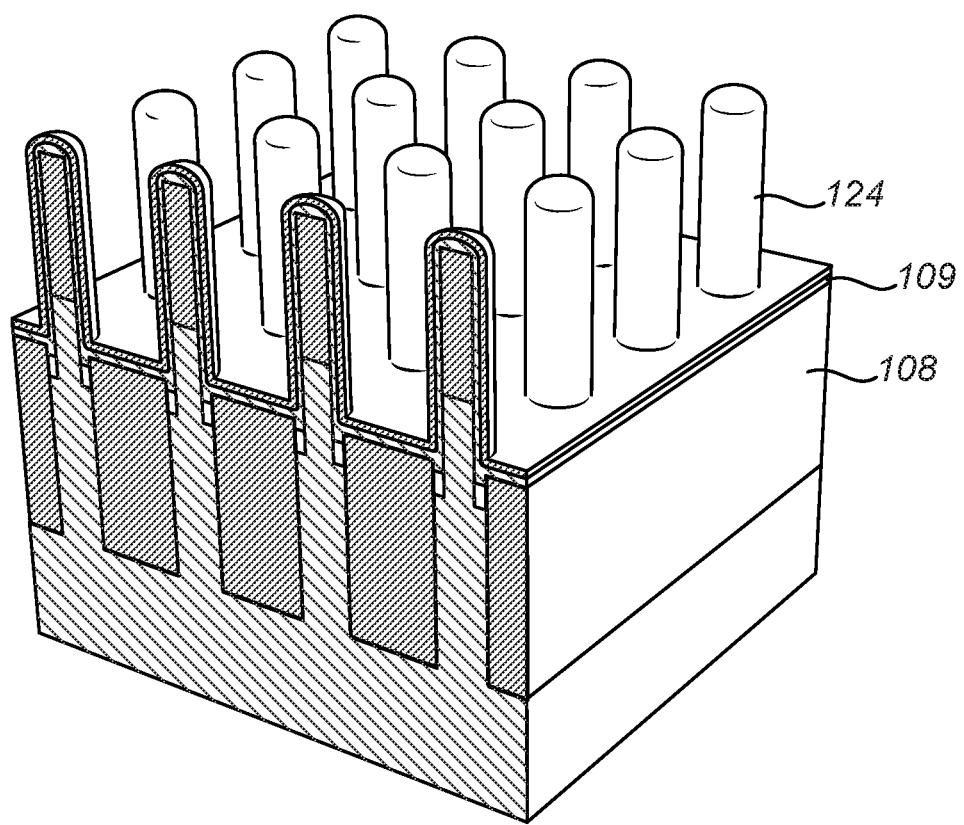
FIG. 1d illustrates an intermediate semiconductor structure at a stage in fabrication of vertical channel devices, including a conformal work function metal (WFM) layer that covers the gate dielectric layer illustrated in FIG. 1c.
Figure 1E:
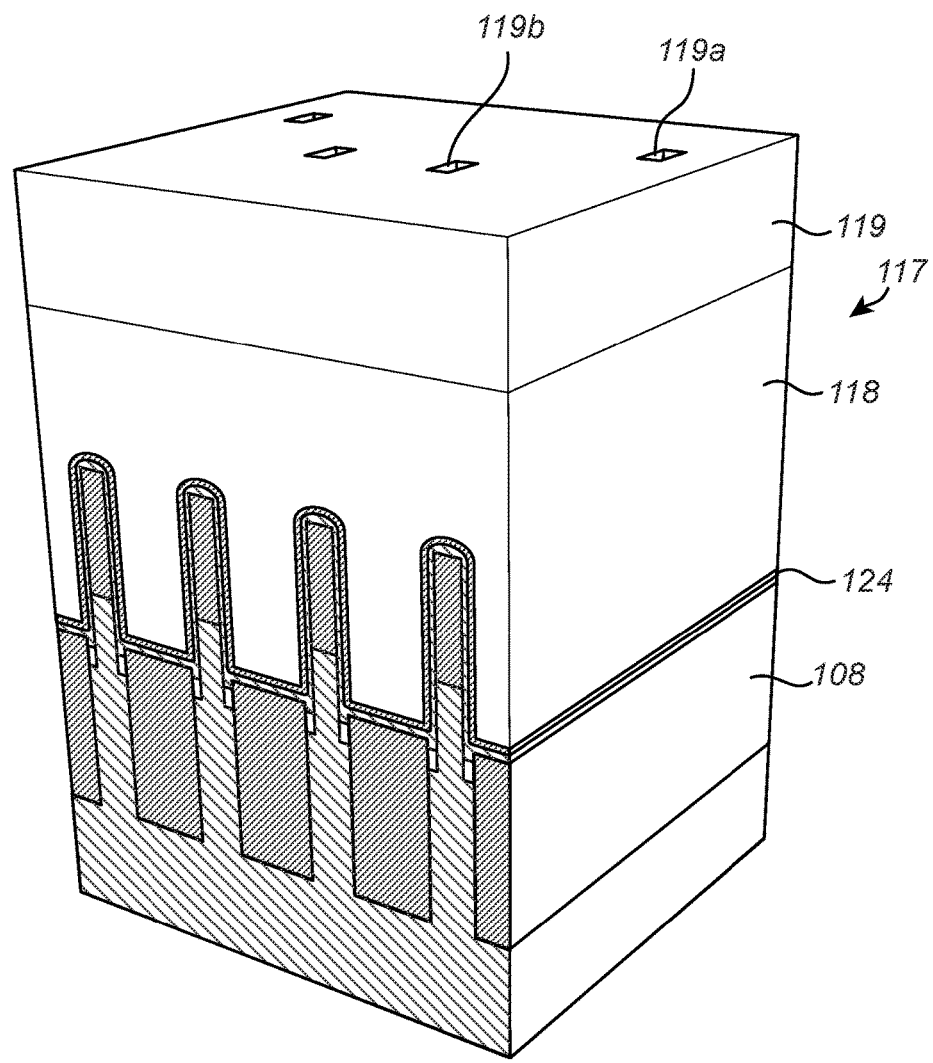
FIG. 1e illustrates an intermediate semiconductor structure at a stage in fabrication of interconnected vertical channel devices, including a mask layer that has been formed to cover the protruding portions of the vertical channel structures and the WFM layer illustrated in FIG. 1d, and including holes patterned in the photo-resist layer formed by a lithographic process and transferred into the lower layers of the mask layer by etching.
Figure 1F:
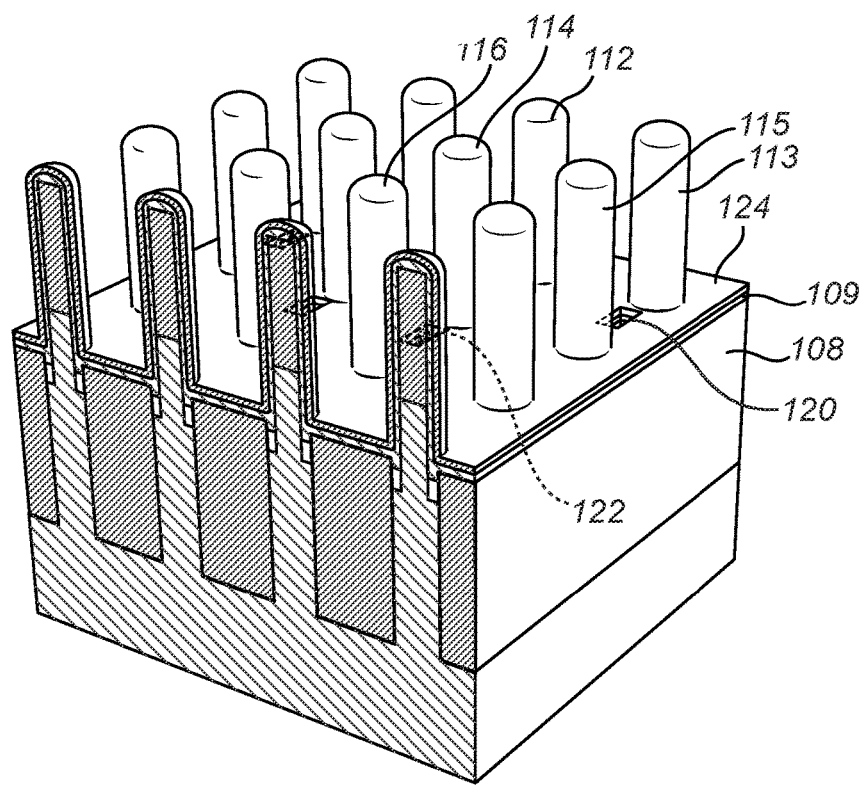
FIG. 1f illustrates an intermediate semiconductor structure at a stage in fabrication of vertical channel devices, including a first hole exposing the first bottom electrode region illustrated in FIG. 1d. Vertical channel structures are also shown.

As shown in FIGS. 1e-1f the method comprises forming a first hole 120 exposing the first bottom electrode region 102 and a second hole 122 exposing the second bottom electrode region 104. The first and the second hole 120, 122 extend through the dielectric layer 108.

Figure 1G:
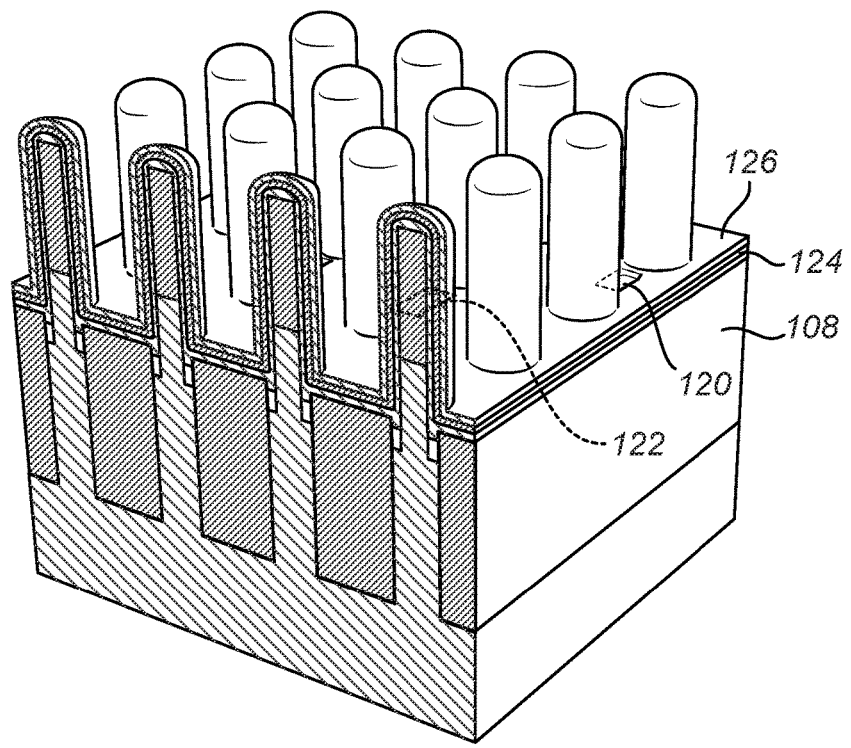
FIG. 1g illustrates an intermediate semiconductor structure at a stage in fabrication of vertical channel devices, including a conformal metal contact layer that has been formed on the protruding portions of the vertical channel structures illustrated in FIG. 1f.
Figure 1H:
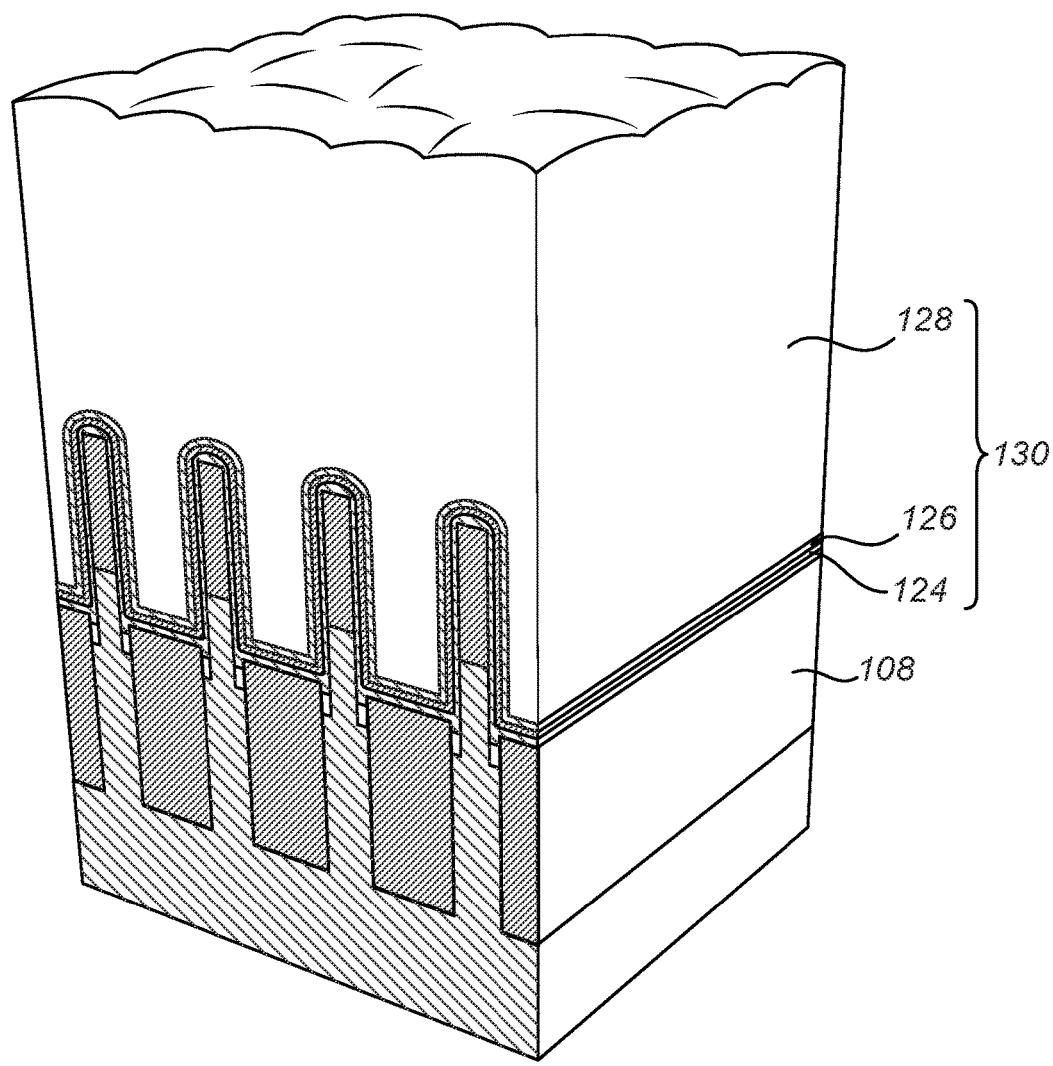
FIG. 1h illustrates an intermediate semiconductor structure at a stage in fabrication of vertical channel devices, including a metal fill layer that is formed on the contact layer and to embed the protruding portions of the vertical channel structures illustrated in FIG. 1g.
Figure 1I:
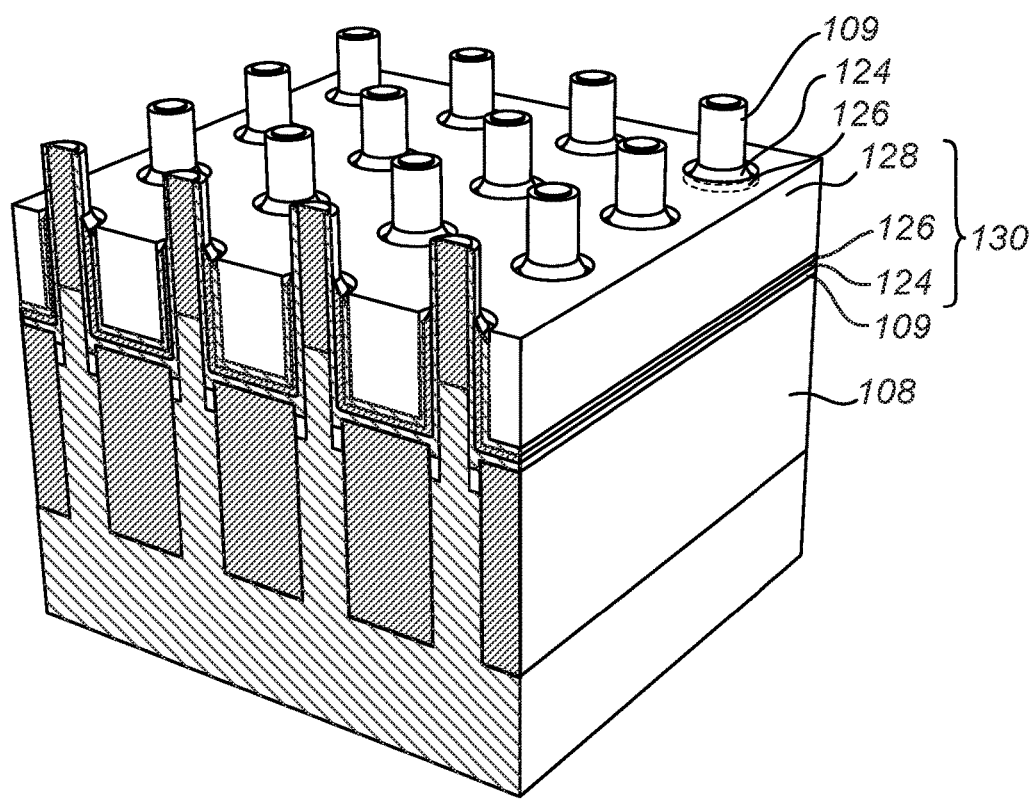
FIG. 1i illustrates an intermediate semiconductor structure at a stage in fabrication of vertical channel devices, including portions of the WFM layer, contact layer and the fill layer illustrated in FIG. 1h removed from the upper portions of the vertical channel structures by reducing a thickness of the gate level electrode.

As shown in FIGS. 1g-1i a gate level conductor 130 including at least one conductive layer such as layers 124, 126, 128 is formed to fill the first and the second hole 120, 122 and embed the protruding portions of the first and second vertical channel structures 111, 112.

Figure 1J:
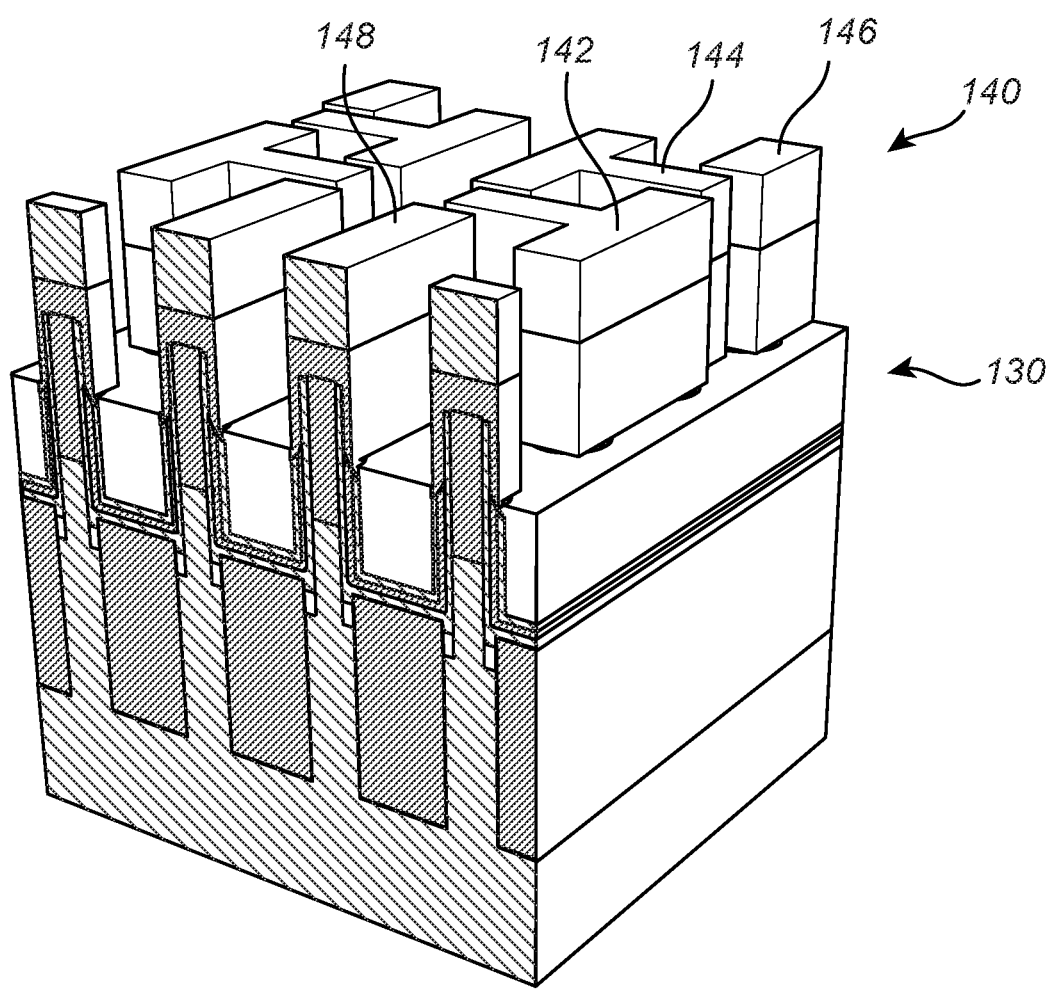
FIG. 1j illustrates an intermediate semiconductor structure at a stage in fabrication of vertical channel devices, including with an etch mask that is formed above the gate level conductor illustrated in FIG. 1i. The etch mask includes a number of discrete mask portions.
Figure 1K:
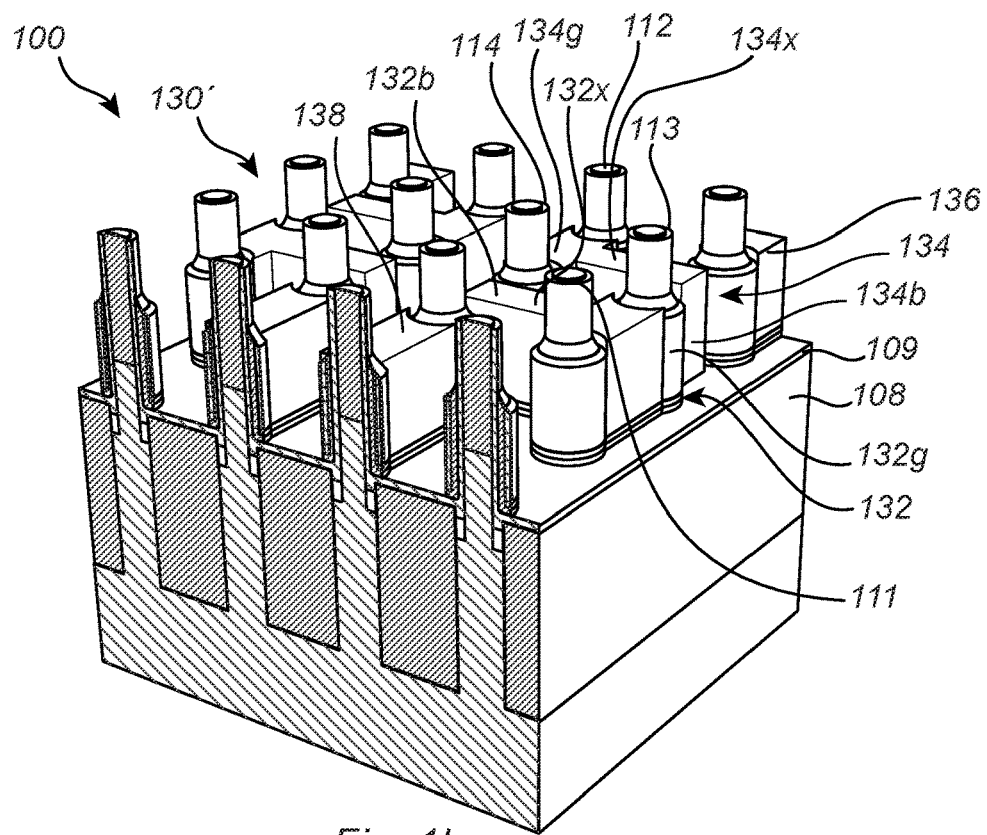
FIG. 1k illustrates an intermediate semiconductor structure at a stage in fabrication of vertical channel devices, in which the pattern of the etch mask illustrated in FIG. 1j has been transferred into the gate level conductor by etching the gate level conductor in regions exposed by the etch mask.

As shown in FIGS. 1j-1k a conductive pattern 130' is formed on the dielectric layer 108 including a first pattern part 132 and a second pattern part 134. The first pattern part 132 is formed to include a first gate portion 132g wrapping around the first channel structure 111, a first bottom electrode contact portion 132b arranged in the second hole 122, and a first cross-coupling portion 132x extending between the first bottom electrode contact portion 132b and the first gate portion 132g. The second pattern part 134 is formed to include a second gate portion 134g wrapping around the second channel structure 112, a second bottom electrode contact portion 134b arranged in the first hole 120, and a second cross-coupling portion 134x extending between the second bottom electrode contact portion 134b and the second gate portion 134g.

With reference to FIG. 1a there is shown, in perspective, a section of a semiconductor structure or intermediate device 100. The structure 100 may extend laterally or horizontally beyond the illustrated section. The illustrated planes of section extending through the structure 100 are common to all the Figures.

It is noted that the relative dimensions of the shown structures, for instance the relative thickness of layers, is merely schematic and may, for the purpose of illustrational clarity, differ from a physical structure.

The structure 100 includes a semiconductor substrate 101. The semiconductor substrate 101 may be a silicon (Si) substrate, a germanium (Ge) substrate, a silicon germanium (SiGe) substrate, or a semiconductor on insulator (SOI) substrate to name a few. The substrate 101 may further be a stack of thin layers of two or more of the aforementioned semiconductors.

A number of bottom electrode regions including the first and the second bottom electrode regions 102, 104 are formed on the substrate 101. The bottom electrode regions may as shown be formed as fin-shaped regions on the semiconductor substrate 101.

The semiconductor structure includes a plurality of vertical channel structures extending from the bottom electrode regions. A first, a third and a fifth vertical channel structure 111, 113, 115 extends from the first bottom electrode region 102. A second, a fourth and a sixth vertical channel structure 112, 114, 116 extends from the second bottom electrode region 104. The vertical channel structures 111-116 each extend in parallel to the vertical direction or normal direction of the substrate 101, indicated by "V" in FIG. 1a. The horizontal direction defined by the substrate 101 is indicated by "H".

In the illustrated semiconductor structure 100, three vertical channel structures extends from each bottom electrode region 102, 104. This however merely represents an example and is dependent on the type of circuitry that is to be formed. Hence fewer or more vertical channel structures may extend from each bottom electrode region. For instance, only a single or only two vertical channel structures may extend from each bottom electrode region.

Forming the semiconductor structure shown in FIG. 1a may include growing a semiconductor layer (not shown in FIG. 1a) on top of the substrate 101. The semiconductor layer may be grown in an epitaxial growth process. The semiconductor layer may for instance be an un-doped or intrinsically doped (e.g. by an n- or p-type dopant) semiconductor layer. The semiconductor layer may for instance be formed by Si or SiGe. Vertical semiconductor structures 111-116 may be formed by etching the semiconductor layer using one or more vertical and anisotropic etch steps. The etching of the semiconductor layer may be preceded with deposition and patterning of a lithographic stack to form mask portions allowing etching of the vertical channel structures. Lithographic stacks and etching processes for forming vertical semiconductor structures is per se known in the art and will therefore not be further described herein.

The etching may be stopped when a top surface of the semiconductor substrate 101 is reached. Alternatively, the etching may be extended also into the semiconductor substrate 101. Vertical channel structures including a vertical portion formed by material of a thickness portion of the semiconductor substrate 101 and a vertical portion formed by a thickness portion of the material of the semiconductor layer may thereby be formed.

Bottom electrode regions including the regions 102 and 104 may subsequently be formed by a further lithography and etching process. A lithographic stack may be deposited and patterned to form mask portions defining the dimensions and positions of the bottom electrode regions. The semiconductor substrate 101 may thereafter be etched in regions exposed by the mask portions to form the bottom electrode regions as shown in FIG. 1a.

Prior to the etching to form the bottom electrode regions, ion implantation may be performed to form n-type and p-type regions in the semiconductor substrate 101 in accordance with the type of device that is to be formed.

For the semiconductor structure illustrated in FIG. 1a, p- and n-type ion implantation may be performed in respective regions of the semiconductor substrate 101 such that, once the bottom electrode regions are formed, each bottom electrode region is provided with a first and a third sub-region each doped with a p-type dopant, and a second sub-region intermediate the first and third sub-regions and doped with an n-type dopant. Alternatively, each bottom electrode region may be provided with a first and a third sub-region each doped with an n-type dopant, and a second sub-region intermediate the first and third sub-regions and doped with a p-type dopant.

Silicidation may be performed at the junctions between the sub-regions to enable a low-resistance connection of the source/drains of the vertical channel structures formed on each bottom electrode region.

The first vertical channel structure 111 may extend from the first sub-region of the first bottom electrode region 102. The third vertical channel structure 113 may extend from the second sub-region of the first bottom electrode region 102. The fifth vertical channel structure 115 may extend from the third sub-region of the first bottom electrode region 102. The second vertical channel structure 112 may extend from the first sub-region of the second bottom electrode region 104. The fourth vertical channel structure 114 may extend from the second sub-region of the second bottom electrode region 104. The sixth vertical channel structure 116 may extend from the third sub-region of the second bottom electrode region 104.

It should be noted that the particular configuration and doping of sub-regions of the respective bottom electrode regions may depend on the type of device or circuit that is to be formed. For instance, the semiconductor structure may alternatively be formed such that only two vertical channel structures extend from each bottom electrode region. Accordingly, each bottom electrode region may include only a first and a second sub-region doped with a p- and an n-type dopant, respectively, or vice versa.

In the above, an example on how to form the vertical channel structures shown in FIG. 1a has been given. However, also other techniques are possible. For instance the vertical channel structures 111-116 may be formed by epitaxially growing vertical semiconductor structures within vertical apertures formed in a sacrificial dielectric layer deposited on the semiconductor substrate 101. After completing the growth process, the sacrificial dielectric layer may be removed.

In FIG. 1b a dielectric layer 108 has been formed on the semiconductor substrate 101. The dielectric layer 108 covers the bottom electrode regions including the first and second bottom electrode regions 102, 104. The vertical channel structure including the vertical channel structures 111-116 protrude from the dielectric layer 108 to present respective protruding portions. As will be appreciated the dielectric layer 108 provides an offset between the gate portions to be formed and the bottom electrode regions. Electrical isolation between the gate portions and the bottom electrode regions 102, 104 may hence be provided.

The dielectric layer 108 may be formed by a dielectric material. The dielectric layer 108 may include a silicon oxide material, such as $SiO_2$, an organo-silicate-glass material or another low-K dielectric material. The dielectric layer 108 may also include a stack of layers of different dielectric materials. The dielectric layer 108 may be deposited by any conventional deposition process, such as chemical vapor deposition (CVD). The dielectric layer 108 may be deposited to completely cover the vertical channel structures 111-116. The thickness of the dielectric layer 108 may thereafter be reduced until protruding portions of the vertical channel structures 111-116 of a desired height have been obtained. The thickness reduction may be achieved by selectively etching the dielectric layer 108 with respect to the vertical channel structures 111-116.

As indicated, a dielectric liner 105 may be formed on the upper surface of the bottom electrode regions 102, 104. The dielectric liner 105 may be a nitride-based liner, such as SiN. The dielectric liner 105 may be formed on the substrate 101 prior to the afore-mentioned etching of the substrate 101 for forming of the bottom electrode regions 102, 104. Portions of the dielectric liner 105 remaining on the protruding portions of the vertical channel structures 111-116 may be removed after the dielectric layer 108 has been finally formed.

In FIG. 1c a conformal gate dielectric layer 109 has been formed. The gate dielectric layer 109 covers the dielectric layer 108 and the protruding portions of the vertical channel structures 111-116. As shown, portions of the gate dielectric layer 109 encloses the vertical channel structures 111-116 in a circumferential direction. Hence, the gate dielectric layer 109 covers the sidewall surfaces of the vertical channel structures 111-116.

The gate dielectric layer 109 may be deposited as a conformal thin film. The gate dielectric layer 109 may comprise a dielectric material such as a high-K dielectric material. The gate dielectric layer 109 may for instance comprise $HfO_2$, $ZrO_2$, $Al_2O_3$, or other rare-earth oxides or metal oxide silicates such as $HfSiO_x$, $YSiO_x$, or $LaSiO_x$. The gate dielectric layer 109 may comprise one layer of a dielectric material or by a stack of different dielectric materials. The gate dielectric layer 109 may be deposited by any conventional deposition process, for instance by atomic layer deposition (ALD).

In FIG. 1d a conformal work function metal (WFM) layer 124 has been formed. The WFM layer 124 covers the gate dielectric layer 109 on the protruding portions of the vertical channel structures 111-116 and on the dielectric layer 108. The WFM layer 124 may form a first layer of an overall or composite gate level conductor 130. The WFM layer 124 may comprise one metal material or by a stack of layers of one or more metal materials. The WFM layer 124 may for instance comprise a p-type work function metal such as TiN, TaN, TiTaN or by a stack of layers of such materials. The WFM layer 124 may also comprise an n-type work function metal such as Al, TiAl, TiC, or TiAlC or by a stack of layers of such materials. The WFM layer 124 may be deposited by any conventional deposition process, for instance by ALD, CVD or tilted physical vapor deposition (PVD).

In FIG. 1e a mask layer 117 has been formed to cover the protruding portions of the vertical channel structures 111-116. As shown the mask layer 117 covers also the WFM layer 124. The mask layer 117 may be a conventional lithographic stack. As shown, the mask layer 117 may include, in a bottom up direction, a spin-on-carbon (SOC) layer 118 and a photo-resist layer 119. Holes 119a, 119b may be patterned in the photo-resist layer in a lithographic process, and transferred into the lower layers of the mask layer 117 by etching. The positions of the holes 119a, 119b define the positions of the first and the second holes 120, 121, respectively, which are to be formed above the first and the second bottom electrode regions 102, 104, respectively.

In FIG. 1f the first hole 120 exposing the first bottom electrode region 102 and the second hole 122 exposing the second bottom electrode region 104 have been formed. The holes 120, 122 extend vertically through the dielectric layer 108. The portion of the first bottom electrode region 102 exposed by the first hole 120 forms a bottom surface of the first hole 120. The portion of the second bottom electrode region 104 exposed by the second hole 122 forms a bottom surface of the second hole 122. A respective sidewall surface of the holes 120, 122 is formed by at least the dielectric layer 108.

The first hole 120 is formed at a position between the third and the fifth vertical channel structures 113, 115. The second hole 122 is formed at a position between the fourth and sixth vertical channel structures 114, 116. The holes 120, 122 may be formed by transferring the holes in the mask layer 117 into the dielectric layer 108 by etching through the holes in the mask layer 117. An anisotropic dry etching process may be used for etching the holes 120, 122. The etching process may be of any type allowing etching of the dielectric material 108, selectively to the materials of the mask layer 117 (for instance at least selectively to the SOC layer 118). For instance, a CF-based etching chemistry may be used.

The holes 120, 122 extend also through the metal layer 124 and the gate dielectric layer 109. If a liner layer 105 is present on the bottom electrode regions 102, 104, the hole may extend also through the liner layer 105. The process conditions and/or the chemistries of the etching process may be varied during the etching of the holes 120, 122 to enable opening of the metal layer 124, the gate dielectric layer 114 and the liner layer 105, if present. For instance a Cl-based etching chemistry and/or a F-based etching chemistry may be used.

In FIG. 1g a conformal metal contact layer 126 has been formed on the protruding portions of the vertical channel structures 111-116 and in the first and second hole 120, 122. The contact layer 126 covers the sidewall and bottom surface of the holes 120, 122. The contact layer 126 hence abuts and electrically contacts the first and the second bottom electrode regions 102, 104. The contact layer 126 covers also the WFM layer 124. The contact layer 126 may form a second layer of the composite gate level conductor 130. The contact layer 126 may be formed by one metal material or by a stack of layers of one or more metal materials. The contact layer 126 may for instance be formed by a metal providing a low-resistance connection with the bottom electrode regions 102, 104. The contact layer 126 may for instance be formed by Ti, TiN or WN. The contact layer 126 may be deposited by any conventional deposition process, for instance by ALD, CVD or PVD.

In FIG. 1h a metal fill layer 128 has been formed on the contact layer 126 and to embed the protruding portions of the vertical channel structures 111-116. The metal fill layer 128 may further fill a remaining space in the first and the second hole 120, 122 unless the holes 120, 122 already are completely filled by the contact layer 126. The fill layer 128 has been deposited to completely embed or cover the vertical channel structures 111-116. The fill layer 128 may form a third layer of the composite gate level conductor 130. The fill layer 128 may be formed by one metal material or by a stack of layers of one or more metal materials. The contact layer 126 may for instance be formed by a metal having a sufficient conductivity and fill properties. The fill layer 128 may for instance be formed by W, Al, Co, Ni, Ru or an alloy of two or more of the materials. The fill layer 128 may be deposited by any conventional deposition process, for instance by CVD or by electro-plating.

In FIG. 1i portions of the layers WFM layer 124, the contact layer 126 and the fill layer 128 have been removed from upper portions of the vertical channel structures 111-116 by reducing a thickness of the gate level conductor 130. Due to the vertical orientation of the channel structures 111-116, the gate length for the vertical channel structures is defined by the thickness of the gate level conductor 130, i.e. the dimension along the vertical direction V.

Depending on the materials and composition of the gate level conductor 130, the thickness reduction may include a number of different process steps such as polishing, for instance by chemical mechanical polishing (CMP), and etching. If the layers of the gate level conductor 130 may be etched at a substantially same rate by a common etching chemistry a single etch step may suffice. Alternatively, an etching process including a number of etching steps may be used. The one or more etching processes are preferably selective with respect to the gate dielectric layer 109 wherein the vertical channel structures 111-116 may be protected from the etching chemistries used during the thickness reduction.

The thickness reduction of the gate level conductor 130 may proceed as follows:

First, a thickness of the fill layer 128 may be reduced to expose top portions of the WFM layer 124 and/or the contact layer 126. The top portions of the WFM layer 124 and/or the contact layer 126 may be the portions formed on the top surfaces of the vertical channel structures 111-116. The thickness reduction of the fill layer 128 may be achieved by a polishing process, such as chemical mechanical polishing (CMP). The thickness reduction of the fill layer 128 may additionally or alternatively be achieved by an etching process. The etching process may be an isotropic etching process. The etching process may include a wet etching chemistry. Subsequently, a thickness of the fill layer 128 may be further reduced to expose a vertical section of the contact layer 126 covering the WFM layer 124, along the vertical channel structures 111-116. The thickness reduction of the fill layer 128 may be achieved by an etching process. Subsequently, the WFM layer 124 and the contact layer 126 may be removed along the exposed vertical sections by etching such that the upper portions of the vertical channel structures 111-116 protrude from the reduced thickness gate level conductor 130. Suitable etching processes for the various above-mentioned material examples of the layers 124, 126, 128 are known to the skilled person. By way of example, suitable etching chemistries include Cl-based etching chemistry and/or chlorine oxide-based etching chemistry and/or F-based etching chemistry.

As an alternative to the above described gate conductor layer 130 including a WFM layer 124, a contact layer 126 and a fill layer 128, it is also possible to form a gate conductor layer 130 as a single metal layer. The gate conductor layer 130 may in such a case be formed subsequent to forming the holes 120, 122.

In FIG. 1j an etch mask 140 has been formed above the gate level conductor 130. The etch mask 140 includes a number of discrete mask portions 142, 144, 146, 148. Each mask portion defines the horizontal position and horizontal extension of a discrete pattern part of a conductive pattern that is to be formed from the gate level conductor 130.

The etch mask 140 may be formed by forming an etch mask layer covering the gate level conductor 130. The etch mask layer may be a conventional lithographic stack. The etch mask layer may include, in a bottom up direction, a SOC-layer and a photo-resist layer. The photo resist layer may be patterned using a lithographic process. The pattern in the photo resist layer may be transferred into the SOC-layer by etching, thereby forming the discrete mask portions 142, 144, 146, 148 as shown in FIG. 1j.

The etch mask 140 includes a first discrete mask portion 142 for defining a first pattern part 132 and a second discrete mask portion 144 for defining the second pattern part 134 (shown in FIG. 1k).

The first discrete mask portion 142 includes a first sub-portion covering the first vertical channel structure 111 and a portion of the gate level conductor 130 extending about the first vertical channel structure 111. The first discrete mask portion 142 further includes second sub-portion covering a portion of the gate level conductor 130 filling the second hole 122. The first discrete mask portion 142 further includes a third sub-portion extending between the first and second sub-portions. The first discrete mask portion 142 may as shown further include a fourth sub-portion covering the third vertical channel structure 113 and a portion of the gate level conductor 130 extending about the third vertical channel structure 113. This enables forming of a first gate portion which is common to the first and third vertical channel structures 111, 113.

The second discrete mask portion 144 includes a first sub-portion covering the second vertical channel structure 112 and a portion of the gate level conductor 130 extending about the second vertical channel structure 112. The second discrete mask portion 144 further includes second sub-portion covering a portion of the gate level conductor 130 filling the first hole 120. The second discrete mask portion 144 further includes a third sub-portion extending between the first and second sub-portions. The second discrete mask portion 144 may as shown further include a fourth sub-portion covering the fourth vertical channel structure 114 and a portion of the gate level conductor 130 extending about the fourth vertical channel structure 114. This enables forming of a second gate portion which is common to the second and fourth vertical channel structures 112, 114.

The etch mask 140 further includes a third discrete mask portion 146 for defining a third pattern part 136 and a fourth discrete mask portion 148 for defining a fourth pattern part 138.

The third discrete mask portion 146 covers the fifth vertical channel structure 115 and a portion of the gate level conductor 130 extending about the fifth vertical channel structure 115.

The fourth discrete mask portion 148 covers the sixth vertical channel structure 116 and a portion of the gate level conductor 130 extending about the sixth vertical channel structure 116.

As indicated in FIG. 1j the third and fourth discrete mask portions 146, 148 may also cover a respective adjacent vertical channel structure extending from a respective adjacent bottom electrode region. Thereby a respective gate of the fifth and sixth vertical channel structure 115, 116, may be electrically common with a gate of a respective adjacent vertical channel structure. This configuration of the mask portions 146, 148 is however optional and the particular extension of the mask portions 146, 148 may be varied depending on the type of device and circuitry that is to be formed.

In FIG. 1k the pattern of the etch mask 140 has been transferred into the gate level conductor 130 by etching the gate level conductor 130 in regions exposed by the etch mask 140. A conductive pattern 130' including a set of discrete pattern parts 132, 134, 136, 138 has thereby been formed on the dielectric layer 108. As shown, each pattern part 132, 134, 136, 138 is formed as a single piece. The etch mask 140 has subsequently been removed. The etching of the gate level conductor 130 may be performed by an etching process including any of the etching chemistries discussed above, in connection with the thickness reduction of the gate level conductor 130. The etching of the gate level conductor 130 may be stopped when the gate level dielectric 109 is exposed or when the dielectric layer 108 is exposed.

The first pattern part 132 includes a first gate portion 132g wrapping around the protruding portion of the first vertical channel structure 111. The first gate portion 132g wraps around also the protruding portion of the third vertical channel structure 113. The first pattern part 132 includes a first bottom electrode contact portion 132b arranged in the second hole 122 and protruding therefrom. The first pattern part 132 includes a first cross-coupling portion 132x extending between the first bottom electrode contact portion 132b and the first gate portion 132g.

The second pattern part 134 includes a second gate portion 134g wrapping around the protruding portion of the second vertical channel structure 112. The second gate portion 134g wraps around also the protruding portion of the fourth vertical channel structure 114. The second pattern part 134 includes a second bottom electrode contact portion 134b arranged in the first hole 120 and protruding therefrom. The second pattern part 134 includes a second cross-coupling portion 134x extending between the second bottom electrode contact portion 134b and the second gate portion 134g.

The common gate portion 132g of the first and third vertical channel structures 111, 113 is electrically connected to the bottom electrode region of the second and fourth vertical channel structures 112, 114 via the first cross-coupling portion 132x and the first bottom electrode contact portion 132b. Correspondingly, the common gate portion 134g of the second and fourth vertical channel structures 112, 114 is electrically connected to the bottom electrode region of the second and fourth vertical channel structures 112, 114 via the second cross-coupling portion 134x and the second bottom electrode contact portion 134b.

The third pattern part 136 includes a gate portion wrapping around a protruding portion of the fifth vertical channel structure 115. The fourth pattern part 138 includes a gate portion 138g wrapping around a protruding portion of the sixth vertical channel structure 116.

As shown in FIG. 1k, the third pattern part 136 may further include a gate portion wrapping around a protruding portion of a vertical channel structure adjacent to the fifth vertical channel structure 115 and extending from an adjacent bottom electrode region. The fourth pattern part 138 may further include a gate portion wrapping around a protruding portion of a vertical channel structure adjacent to the sixth vertical channel structure 116 and extending from an adjacent bottom electrode region. This is a result of the above described extension of the mask portions 146, 148.

Figure 1L:
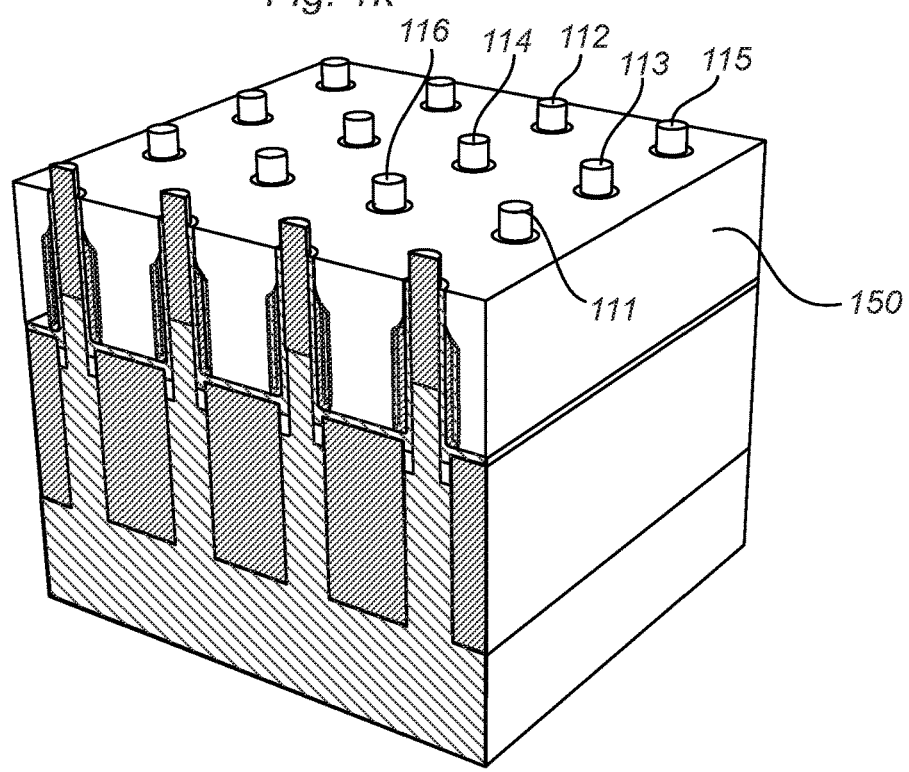
FIG. 1l illustrates an intermediate semiconductor structure at a stage in fabrication of vertical channel devices, in which a dielectric fill layer embeds the patterned parts illustrated in FIG. 1k.

In FIG. 1l a dielectric fill layer 150 embedding the pattern parts 132, 134, 136, 138 has been formed. The dielectric fill layer 150 is formed such that a top portion of the vertical channel structure 111-116 protrudes above the upper surface of the dielectric fill layer 150.

The dielectric fill layer 150 may be formed by a dielectric material of a same type of the dielectric layer 108 and be formed using a same type of deposition process.

The dielectric fill layer 150 may be deposited to completely cover the vertical channel structures 111-116. The thickness of the dielectric fill layer 150 may thereafter be reduced until the vertical channel structures 111-116 protrude above the dielectric fill layer 150 by a desired amount. The thickness reduction may be achieved by selectively etching the dielectric layer 108 with respect to the vertical channel structures 111-116. During the thickness reduction, portions of the gate dielectric layer 109 may also be stripped from the top portions of the vertical channel structures 110.

Figure 1M:
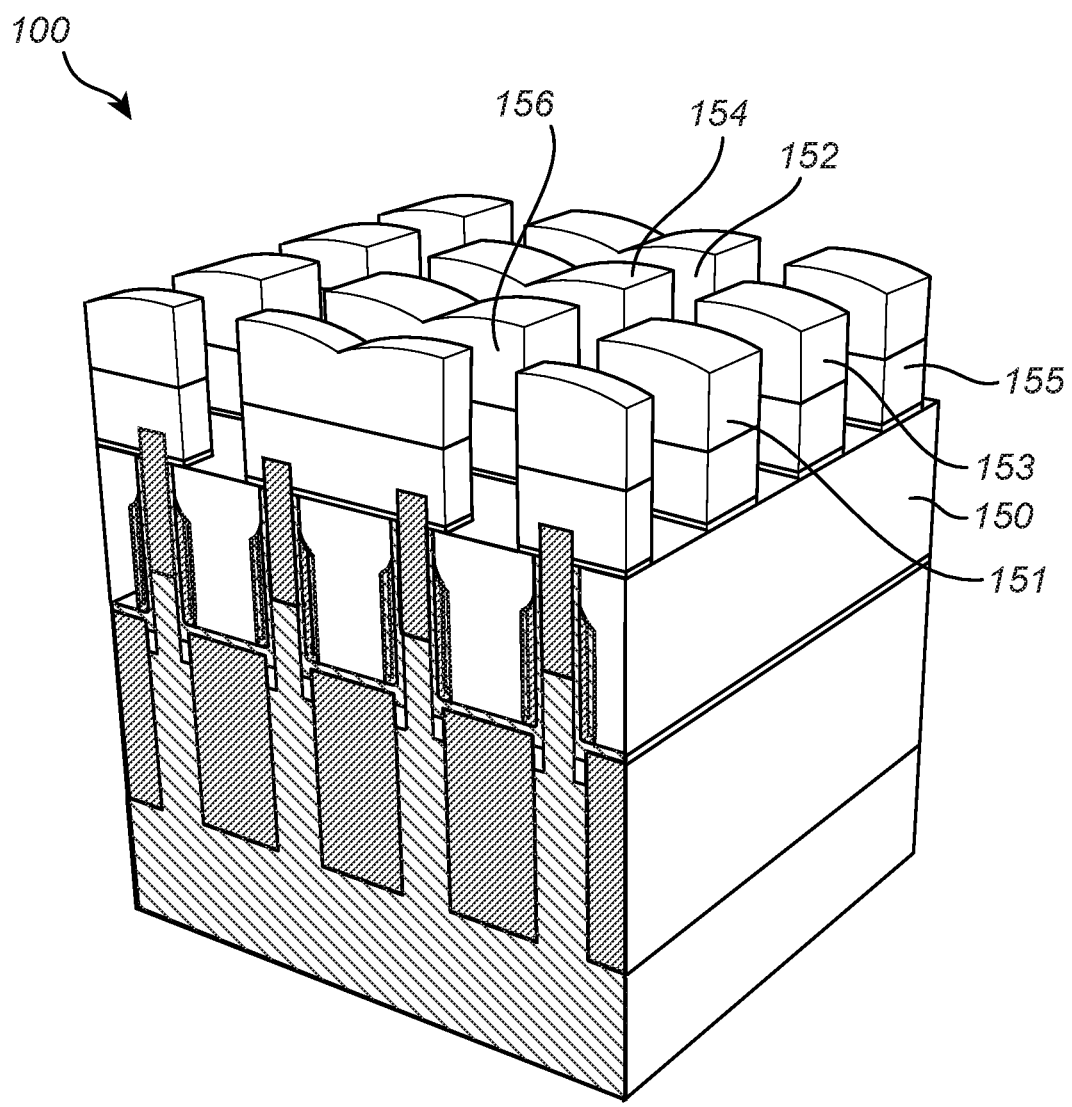
FIG. 1m illustrates an intermediate semiconductor structure at a stage in fabrication of vertical channel devices, in which a set of top electrodes have been formed at the top portions of the vertical channel structures.

In FIG. 1m a set of top electrodes have been formed at the top portions of the vertical channel structures 111-116. A first top electrode 151 formed is formed at the top portion of the first vertical channel structure 111. A second top electrode 152 is formed at the top portion of the second vertical channel structure 112. A third top electrode 153 is formed at the top portion of the third vertical channel structure 113. A fourth top electrode 154 is formed at the top portion of the fourth vertical channel structure 114. A fifth top electrode 155 is formed at the top portion of the fifth vertical channel structure 115. A sixth top electrode 156 is formed at the top portion of the sixth vertical channel structure 116.

As shown in FIG. 1m, the top electrodes 152, 154 and 156 may be formed to cover also a top portion of a respective adjacent vertical channel structure of an adjacent bottom electrode region. Top electrodes may accordingly be shared between vertical channel structures of different bottom electrodes. This configuration of the top electrodes 152, 156 is however optional and their particular extension may be varied depending on the type of device and circuitry that is to be formed The set top electrodes may be formed by depositing a top electrode layer including one or more metal layers and covering the top portions of the vertical channel structure 111-116 and the dielectric fill layer 150. A lithographic layer stack including a mask layer and a photo resist layer may be formed on the top electrode layer. The photo resist layer may be patterned using a lithographic process. The pattern in the photo resist layer may be transferred into the mask layer by etching. The pattern formed in the mask layer may subsequently be transferred into the top electrode layer by etching while using the patterned mask layer as an etch mask.

Prior to forming of the set of top electrodes, ion implantation may be performed in the protruding portions of the vertical channel structures 111-116 in accordance with the channel types of devices. The protruding portions of the first, third and fifth vertical channel structures 111, 113, 115 may be doped with an n-, p- and n-type dopant respectively. The protruding portions of the second, fourth and sixth vertical channel structures 112, 114, 116 may be doped with an n-, p- and n-type dopant respectively. Alternately, the protruding portions of the first, third and fifth vertical channel structures 111, 113, 115 may be doped with an p-, n- and p-type dopant respectively. The protruding portions of the second, fourth and sixth vertical channel structures 112, 114, 116 may be doped with an p-, n- and p-type dopant respectively.

It should be noted that the particular layout and configuration of the top electrodes may change depending on the type of circuitry that is to be formed as well as on the number of vertical channel structures formed on each bottom electrode region.

As may be understood from the above, a semiconductor structure or device 100 may be formed including a plurality of vertical channel devices wherein each vertical channel device includes a vertical channel structure (e.g. structure 111-116). More specifically, the vertical channel devices may be vertical channel transistor devices. A channel region of each vertical channel device may be formed in a portion of a respective vertical channel structure enclosed by a respective gate portion. A first source/drain region may be formed in a portion of the vertical channel structure arranged below the channel region portion. The first source/drain region may also extend into the bottom electrode region. A second source/drain region may be formed in a top portion of the vertical channel structure.

The structure shown in FIG. 1m may advantageously be used for forming bit cells of an SRAM device. During back-end-of-line processing routing layers may be formed above the structure. The routing layers may include one or more interconnection levels. The routing layers may include a pull-up voltage line (VSS) and a pull-down voltage line (VDD). The routing layers may include a bit line (BL) and a word line (WL) or select line (SL).

By way of example, the top electrodes 151 and 152 of the first and second vertical channel structures 111, 112 may be connected to the pull-up voltage line VDD. The top electrodes 153 and 154 of the third and fourth vertical channel structures 113, 114 may be connected to the pull-down voltage line VSS. The top electrodes 155, 156 of the fifth and sixth vertical channel structures 115, 116 may be connected to the bit line BL. The gate portions 136 and 138 of the fifth and sixth vertical channel structures 115, 116 may be connected to the word/select line WL. The connections to the respective lines VDD, VSS, BL, WL may be formed by forming vertical conductive vias in a manner which per se is known to the skilled person, for instance in a damascene style process.

As shown above, the disclosed technology has mainly been described with reference to a limited number of examples. However, as is readily appreciated by a person skilled in the art, other examples than the ones disclosed above are equally possible within the scope of the disclosed technology, as defined by the appended claims.

While certain embodiments of the disclosed technology have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a vertical channel device, the method comprising:
   forming a first vertical channel structure extending from a first bottom electrode region and a second vertical channel structure extending from a second bottom electrode region, wherein the first and the second vertical channel structures protrude from a dielectric layer covering the first and second bottom electrode regions;
   forming a first hole exposing the first bottom electrode region and a second hole exposing the second bottom electrode region, wherein the first and the second holes extend vertically through the dielectric layer;
   forming a gate level conductor including at least one conductive layer, wherein the gate level conductor fills the first and the second holes and embeds protruding portions of the first and second vertical channel structures; and
   forming a conductive pattern including a set of discrete pattern parts on the dielectric layer, wherein forming the conductive pattern includes:
      forming a first pattern part including a first gate portion wrapping around a protruding portion of the first vertical channel structure, wherein a first bottom electrode contact portion is arranged in the second hole, and a first cross-coupling portion extends between the first bottom electrode contact portion and the first gate portion,
      forming a second pattern part including a second gate portion wrapping around a protruding portion of the second vertical channel structure, wherein a second bottom electrode contact portion is arranged in the first hole, and a second cross-coupling portion extends between the second bottom electrode contact portion and the second gate portion,
      forming an etch mask above the gate level conductor, wherein the etch mask includes a first discrete mask portion for defining the first pattern part and a second discrete mask portion for defining the second pattern part, and etching the gate level conductor in a region exposed by the etch mask.

2. The method according to claim 1, wherein forming the gate level conductor further comprises forming at least one conductive layer that fills the first and the second holes and embeds the protruding portions of the first and second vertical channel structures.

3. The method according to claim 2, wherein forming the conductive pattern further comprises: forming an etch mask above the gate level conductor, wherein the etch mask includes a first discrete mask portion for defining the first pattern part and a second discrete mask portion for defining the second pattern part, and etching the gate level conductor in a region exposed by the etch mask.

4. The method according to claim 3, wherein the gate level conductor includes:

forming a conformal metal contact layer on the protruding portions of the first and second vertical channel structures and in the first and second holes, and forming a metal fill layer on the conformal metal contact layer and embedding the protruding portions of the first and second vertical channel structures.

5. The method according to claim 4, wherein forming the metal fill layer comprises filling a remaining space in the first and the second holes.

6. The method according to claim 3, wherein forming the gate level conductor includes forming a conformal work function metal layer prior to forming the first and the second holes, wherein the conformal work function metal layer is formed on the protruding portions of the first and second vertical channel structures and on the dielectric layer, and wherein forming the first and the second holes includes forming the first and second holes that extend through the conformal work function metal layer and further through the dielectric layer.

7. The method according to claim 3, further comprising, prior to forming the etch mask, removing conductive layer portions from an upper portion of the first and the second vertical channel structures.

8. The method according to claim 3, wherein forming the gate level conductor comprises completely covering the protruding portions of the first and second vertical channel structures.

9. The method according to claim 8, further comprising, prior to forming the etch mask, reducing a thickness of the gate level conductor such that an upper portion of the first and second vertical channel structures protrudes from the gate level conductor.

10. The method according to claim 1, further comprising, prior to forming the first and second holes, forming a gate dielectric layer covering the dielectric layer and the protruding portions of the first and the second vertical channel structures, wherein forming the first and the second holes includes forming the first and the second hole to extend through the gate dielectric layer and the dielectric layer.

11. The method according to claim 1, further comprising embedding the first and second pattern parts in a dielectric fill layer, wherein a top portion of the first and the second vertical channel structures protrudes above the dielectric fill layer.

12. The method according to claim 11, further comprising forming a first top electrode at the top portion of the first vertical channel structure and a second top electrode at the top portion of the second vertical channel structure.

13. The method according to claim 1, further comprising forming a third vertical channel structure extending from the first bottom electrode region and a fourth vertical channel structure extending from the second bottom electrode region, wherein the first gate portion of the first pattern part is formed as a common first gate portion wrapping around the first and third vertical channel structure, and wherein the second gate portion of the second pattern part is formed as a common second gate portion wrapping around the second and fourth vertical channel structure.

14. The method according to claim 13, further comprising forming a fifth vertical channel structure extending from the first bottom electrode region and a sixth vertical channel structure extending from the second bottom electrode region, wherein forming the conductive pattern includes:

forming a third pattern part including a gate portion wrapping around a protruding portion of the fifth vertical channel structure, and forming a fourth pattern part including a gate portion wrapping around a protruding portion of the sixth vertical channel structure.

* * * * *